United States Patent [19]
Street

[11] Patent Number: 6,137,151
[45] Date of Patent: *Oct. 24, 2000

[54] AMORPHOUS SILICON SENSOR ARRAY WITH REDUCED NUMBER OF ADDRESS LINES

[75] Inventor: Robert A. Street, Palo Alto, Calif.

[73] Assignee: Xerox Corporation, Stamford, Conn.

[ * ] Notice: Under 35 U.S.C. 154(b), the term of this patent shall be extended for 174 days.

[21] Appl. No.: 08/752,667

[22] Filed: Nov. 19, 1996

[51] Int. Cl.⁷ ...................................................... H01L 29/78
[52] U.S. Cl. .............................................................. 257/443
[58] Field of Search .............................................. 257/443

[56] References Cited

U.S. PATENT DOCUMENTS

| | | |
|---|---|---|
| 5,017,989 | 5/1991 | Street et al. . |
| 5,164,809 | 11/1992 | Street et al. . |
| 5,262,649 | 11/1993 | Antonuk et al. . |
| 5,475,212 | 12/1995 | Nelson et al. . |

OTHER PUBLICATIONS

Street, et al., "Amorphous Silicon Arrays Develop a Medical Image", *IEEE, Circuits and Devices*, Jul. 1993, pp. 38–42.

*Primary Examiner*—Stephen D. Meier
*Attorney, Agent, or Firm*—Fay, Sharpe, Fagan, Minnich & McKee, LLP

[57] ABSTRACT

An amorphous silicon sensor array is comprised of a plurality of individually addressable sensor elements. A control circuit, including gate lines, data lines and a control lines, selects the elements for readout discharge. The number of gate lines, data lines and control lines are reduced from conventional sensor array selective discharge control systems. The array includes a plurality of clusters of associated sensor elements wherein each element in a cluster includes a switch for switching integrated charge between the associated sensor elements. One of the gate lines and a one of the data lines is associated with each one of the clusters. The control line is associated with each of the sensor elements in each cluster for selectively and independently addressing for discharge the sensor elements in the clusters of the array.

21 Claims, 2 Drawing Sheets

AMORPHOUS SILICON SENSOR ARRAY WITH REDUCED NUMBER OF ADDRESS LINES

BACKGROUND OF THE INVENTION

1. Field of the Invention

The subject invention pertains generally to the field of imaging devices, and in particular to those devices containing an amorphous silicon sensor array.

2. Background Art

Amorphous silicon two-dimensional sensor arrays are well-known devices for real time imaging of incident energy (see R. A. Street et al., "Amorphous Silicon Arrays Develop a Medical Image", *IEEE Circuits and Devices*, July 1993, pp. 38–42, for a general description of the structure of the arrays). Such sensor arrays are particularly advantageous for radiation imaging because they present a relatively large size image sensor array. Sensor arrays operate on the principle of integrating a charge representative of the quantity of visible light incident on the sensor. A phosphor converter A (FIG. 1) generates the visible light B from incident high energy radiation C. Such phosphor converters operate by absorbing X-ray photons to produce high energy electrons which generate electron hole pairs, which in turn form visible light when the electrons and holes recombine. Thus, the amount of visible light generated in the phosphor converter is directly related to the radiation incident on the phosphor.

Each sensor 12 in the array 10 performs two main functions. First, the sensor captures light, and second, it stores electrical charge generated by the light. When incident light is captured by the sensor, it is turned into electrons and the electrons are stored as electrical charge by the capacitance of the sensor. Discharge of this integrated charge comprises an electrical signal representative of the incident light. Accordingly, a control circuit for the sensor array is required to selectively and independently discharge each of the sensors in a manner representative of the incident light, and thus representative of the image causing the incident light which can be conveyed to an imaging apparatus such as a display screen.

In order to convey the representative electrical signal, all sensor arrays include a set of metallization lines extending out from the sensor elements in both an x- and y- direction. These metal line are, of course, connected to an external electronic control system and so there is a need for electrical connection between the metallization lines of the array and the wire communications of the external electronics.

Advancements in sensor arrays have demanded higher and higher resolutions for better quality imaging. Higher resolution essentially means smaller pixel (sensor element) sizes. As the pixel size is reduced it becomes increasingly difficult to make the necessary connections to the signal lines of external devices.

For example, a conventional device includes metallization lines for "data", "bias" or "gate" (note FIG. 1). Such a conventional device can have a pixel size of approximately 127 microns. An eight-inch by ten-inch (8"×10") array has approximately 1500 lines in one direction and 1900 in the other direction. This is a large number of connections to make, and since they are so very close together, it becomes quite difficult to reliably accomplish in an economical and practical manufacturing process.

Present resolution demands have suggested a reduction in pixel size to approximately 60 microns—a halving of the available distance for circuit connection for each pixel from present commercial designs. Accordingly, such a pixel size would require doubling the number of lines that need to be connected so that the lines would be even much closer together than commercial embodiments. The problems in making such connections are therefore magnitudinally increased for a commercially viable sensor array with such high resolution.

The desirability and advantage of reducing the number of address lines to thereby reduce the number of required electrical connections and to expand the spacing between the address lines for improved ease of handling and connecting are readily apparent as design goals.

The present invention describes a new and improved sensor array with a reduced number of address lines which overcomes the problems of the space limitations of prior known sensor elements to provide a new sensor assembly which has increased resolution but is economically practical for conventional connection to signal processing systems and thereby economical to manufacture, and readily adaptable to a plurality of uses for sensor arrays having a variety of configurations and dimensions.

BRIEF SUMMARY OF THE INVENTION

In accordance with the present invention, there is provided an imaging apparatus including a sensor array with a reduced number of address lines for selectively addressing individual sensor elements of the array. The apparatus comprises a plurality of associated sub-pixels individually operating as sensor elements and forming a pixel cluster, wherein the plurality selectively and individually discharge integrated charge to a common data line associated with the pixel cluster by control of a gate line and one or more control lines. The gate line addresses only the cluster by directly controlling a discharge switch for only one of the sub-pixels in the cluster. The other sub-pixels in the cluster are enabled for discharge by the control line. Only the first one of the sub-pixels translates charge directly to the data line by the switch controlled by the gate line. Others of the associated sub-pixels translate charge to the data line through the first sub-pixel by the switches controlled by the control line. The reduced number of address lines results from utilizing the control line as a global line to all the pixel clusters in the array. In other words, each sensor element need not be addressed by a singular intersection of gate line and data line.

In accordance with another aspect of the present invention, the switches comprise a TFT disposed between adjacent sub-pixels for translation of integrated charge therebetween. Each TFT in the cluster is controlled by either tile gate line or the control line.

In accordance with a more limited aspect of the present invention, the clusters comprise four (4) sensor elements and four (4) TFTs. A first sensor element of the four is in electrical communication with the data line through a first TFT which is controlled by the gate line. The other sensor elements communicate charge to the first sensor element by TFT switches controlled by the control line. All of the sub-pixels are commonly biased by a bias line.

One benefit obtained by use of the present invention is a high resolution amorphous silicon sensor array.

Another benefit obtained by the present invention is an imaging apparatus having a sensor array with a reduced number of address lines for improved ease of wiring connection to avoid high cost connection systems to readout electronics.

Another benefit of the subject invention is a high resolution sensor array with a high percentage fill factor that minimizes metallization line space consumption.

Other benefits and advantages of the subject new sensor array will become apparent to those skilled in the art upon a reading and understanding of this specification.

DETAILED DESCRIPTION OF THE INVENTION

Figure 1:
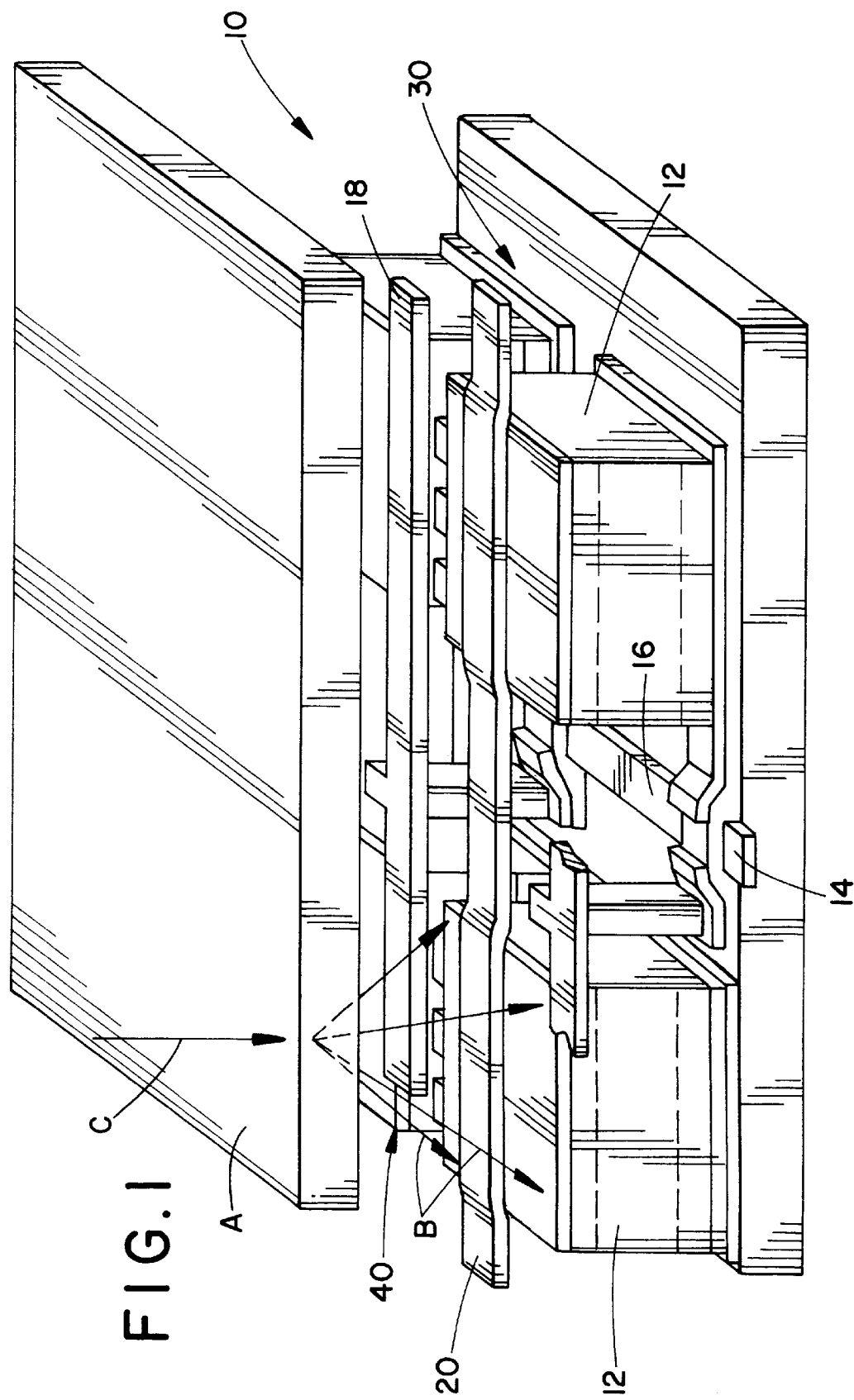
FIG. 1 is a perspective view in partial section of a typical conventional structure of an amorphous silicon sensor array.

Referring now to the drawings, wherein the showings are for purposes of illustrating the preferred embodiments of the invention only, and not for purposes of limiting same, FIG. 1 shows a conventional configuration of an hydrogenated amorphous silicon image sensor array 10, comprised of a plurality of individual pixel elements. Each element is matrix addressable by a thin film transistor (TFT) 14, and a gate line 16 for discharge of the charge that is integrated thereon through data line 18. The circuit metallization structure for signal communication of the charge on each pixel element is conventional and FIG. 1 merely represents one typical schematic embodiment of element configuration including the metallization lines of the sensor array.

It can be seen with reference to FIG. 1, that conventional sensor array architecture disposes a gate line for every column of pixel sensor elements and an output data line for every row of pixel data element. An additionally required bias line maintains a bias charge on each of the elements in order to store the integrated charge. In other words, conventional sensor arrays having a matrix addressed architecture require gate and readout lines at the same pitch as the pixel elements, and these lines are then connected along orthogonal directions essentially by each element.

The subject invention is particularly useful for facilitating electrical connections to a high resolution sensor array with a reduced pitch on the order of 70 microns. The invention reduces the number of address lines necessary to selectively address and discharge the pixel elements of the array, and therefore reduces the number of electrical connections necessary to be made to the array.

Figure 2:
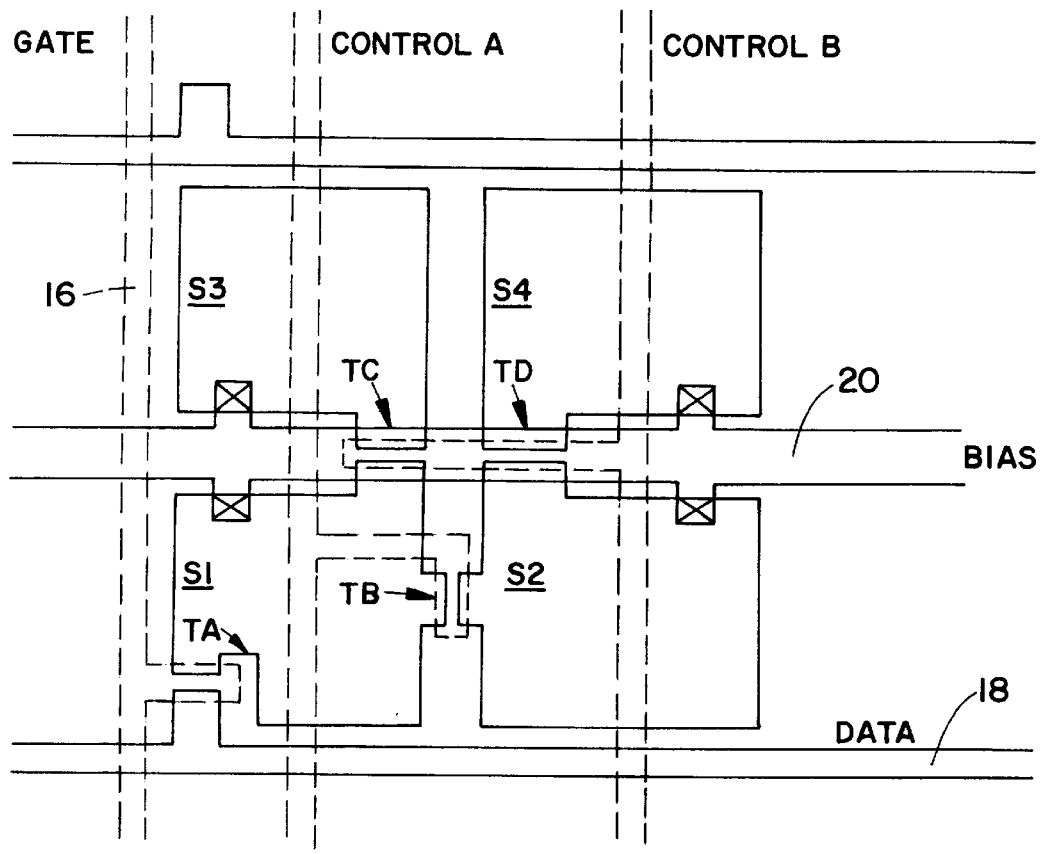
FIG. 2 is a schematic top plan view showing a pixel cluster comprised of four sub-pixels including various metallization lines for selectively discharging the cluster.

FIG. 2 shows an array pixel comprising a cluster of individual sensor elements including a gate line 16, a data line 18 and a bias line 20. A cluster is thus a plurality of sensor elements addressed by one gate line, one data line and at least one control line. The pixel element cluster is divided into four (4) sub-pixel elements, S1, S2, S3, S4. S1 is connected to the data line by TFT TA, operated from the gate line 16 shown at the left side of the FIGURE, in the standard configuration for sensor arrays. Sensors S2, S3, S4 are connected to S1 by TFTs TB, TC, TD. One of these, TB, is operated from control line A and the other two, TC and TD, are operated from control line B.

Thus, one cluster comprised of four elements is matrix addressable with four address lines (i.e., data, gate, control A and control B), which nominally appears conventional, but when two of the address lines can be global, i.e., addressed only once for the whole array, then the structure and operational advantages become readily apparent.

The net effect is reduction of data and gate lines for the whole array by a factor of 2, and a replacement thereof with merely 2 global control lines.

FIG. 2 illustrates just one possible layout for the pixel, although other designs are possible (i.e., 3×3). The gate and control lines are metal lines lying beneath the sensor in FIG. 2, so that the control lines do not reduce the sensor fill factor. The data and bias line are in the top metal array layer as in the conventional sensor array. The design shown in FIG. 1 is fully compatible with the present commercially available sensor processing systems.

Charge Sensing and Readout

During the integration time, the gate line 16 and the two control lines A, B are turned off and the four sub-pixels integrate charge in proportion to the incident illumination, as in the normal sensor array structure. The bias line 20 provides the reverse bias and can also conveniently act as the TFT light sensor shield for TC and TD. Light shields could also be made separate from the bias line.

The readout occurs in four steps as follows:

1. Gate line on; Control A off, Control B off

This condition causes the signal charge on sensor S1 to be transferred to the data line, leaving S1 without charge. The signals on S2, S3, and S4 are unchanged, as they are held for TFTs TB, TC, and TD. The data line 18 is reset from the readout chip (not shown) before the next step.

2. Gate line on, Control A on, Control B off

This condition causes charge on sensor S3 to be transferred through TB and TA to the data lines, leaving S2 without charge. The signal on S3 and S4 is unchanged. The data line is again reset from the readout chip before the next step.

3. Gate line on, Control A off, Control B on

This condition causes charge on sensor S3 to be transferred through S1 to the data line, leaving S3 without charge. At the same time, the charge on S4 will be partially transferred to S2 and shared between the two sensors.

4. Gate line on, Control A on, Control B on

This condition causes all the remaining charge to be transferred to the data line. The charge is on S2 and S4, but is the charge that was originally on S4.

Thus, the readout procedure described above allows charge from each sub-pixel sensor to be transferred to the data line in sequence, S1, S2, S3, S4.

The sub-pixels S1, S2, S3, S4 are thus associated by the TFTs TA, TB, TC, TD which act as switching charge bridges to allow integrated charge to be translated between them and ultimately to the data line 18.

Timing

In order to readout the charge completely, each TFT must have a small enough resistance to provide sufficient RC time constants for charge transfer to the data line. The worst case is when both control lines are on and TFTs TA, TB and TD are transferring charge through three sub-pixels. This will be the limiting case and it is necessary that these TFTs have a sufficiently large W/L for the particular application. Generally, a W/L of 2–4 is probably sufficient for most applications, but will depend primarily on the desired frame time.

Global Enable

Figure 3:
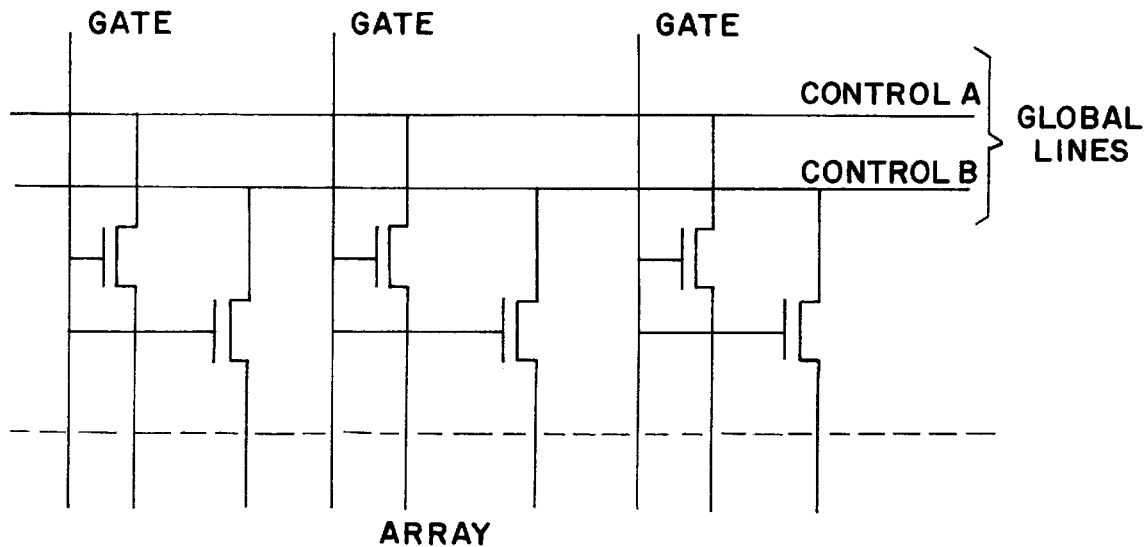
FIG. 3 is a schematic circuit diagram of a portion of a sensor array formed in accordance with the present invention, particularly illustrating global control lines for the sensor array.

A principal point of the design is to reduce the number of external connections, so it is important that control lines A and B are globally addressable. This is achieved by connecting them through TFTs addressed by the gate line 16. Thus, the control lines will be activated only on the column being addressed. The design is illustrated in FIG. 3. Depending on the readout speed required for the system, it might be necessary to make these TFTs with polysilicon rather than aSi:H, but the technology to make arrays with both types of TFTs is conventionally known.

Switching Charge

Addressing the control lines in the design configuration of FIG. 2 will add charge to each sensor element because of a capacitative coupling effect (similar to the usual feedthrough charge arising from the parasitic capacitance of the TFTs). There are a number of ways to deal with this effect.

1. Rely on a software image correction algorithm to remove the switching charge. The extra charge is the same every time the pixel is readout and so will be removed by a dark signal correction which is routinely performed in these arrays. The procedure is to subtract the dark image value for each pixel.

2. Switch the control lines off before turning off TFT TA. This causes the switching charge to be at least partially subtracted from the signal charge.

3. Invert the sensor contacts so that the bias 20 is connected to the lower surface 30 (FIG. 1) and the upper surface 40 is connected to the TFT. The effect is to put a shielded plane between the control line and the sensor, and will remove the switching charge completely. Some extra space in the pixel will be needed to invert the sensor contacts, which will reduce the fill factor slightly but the modified design is easily accomplished.

The subject invention is particularly useful as an image sensor array for document scanning and medical imaging. The advantage of a very high resolution array will substantially improve the quality of the imaging. Current processing technologies have improved to the point where it has become easier and easier to manufacture the smaller pixel elements required for such high resolution. The subject invention overcomes the problems normally associated with high resolution arrays resulting from a large number of electrical connections and the fine pitch.

The invention has been described with reference to the preferred embodiments. Obviously, modifications and alterations will occur to others upon the reading and understanding of this specification. It is my intention to include all such modifications and alterations insofar as they come within the scope of the appended claims or the equivalents thereof.

Having thus described my invention, I now claim:

1. An amorphous silicon sensor array comprised of a plurality of individually addressable sensor elements and a circuit including gate lines, data lines and a control line for selecting the elements for read out discharge, the array including:

a plurality of clusters of associated sensor elements wherein a sensor element in a cluster includes a switch for switching integrated charge to another of the associated sensor elements; and, wherein a one of the gate lines and a one of the data lines is associated with each one of the clusters, and the control line is associated with at least one of the sensor elements in each cluster, for selectively and independently addressing for discharge the sensor elements in the array.

2. The sensor array as defined in claim 1 wherein said switch comprises a TFT disposed between adjacent sensor elements for translation of integrated charge therebetween.

3. The sensor array as defined in claim 2 wherein said TFT is controlled by a one of said gate line or said control line.

4. The sensor array as defined in claim 1 wherein each of said clusters comprises four of the sensor elements and four TFTs.

5. The sensor array as defined in claim 4 wherein said circuit includes a second control line.

6. The sensor array as defined in claim 5 wherein a first sensor element of said four of the sensor elements is in electrical communication with said data line through a first TFT of said four TFTs and an other three sensor elements of said four discharge to the data line through the first sensor element and the first TFT.

7. The sensor array as defined in claim 6 wherein said first TFT is controlled by said gate line.

8. The sensor array as defined in claim 6 wherein a second sensor element of said four communicates integrated charge to the first sensor element through a second TFT of said four TFTs, and the second TFT is controlled by said control line.

9. The sensor array as defined in claim 8 wherein a third sensor element of said four communicates integrated charge to the first sensor element through a third TFT of said four TFTs, and the third TFT is controlled by a second control line.

10. The sensor array as defined in claim 9 wherein a fourth sensor element of said four communicates integrated charge to the second sensor element through a fourth TFT of said four TFTs, said integrated charge is then communicated to the first sensor element through the second TFT, and the fourth TFT is controlled by the second control line.

11. The sensor array of claim 4 wherein said four sensor elements are commonly biased by a bias line.

12. The sensor array as defined in claim 1 wherein said sensor array comprises an amorphous silicon sensor array.

13. A pixel assembly for a sensor array having a reduced number of address lines for selective discharge of charge integrated by the array, comprising:

a pixel addressable in the array by a gate line and a data line, each pixel comprising a plurality of sub-pixels wherein a one of the sub-pixels is in direct communication with the data line by a first switch for translating charge integrated by the one sub-pixel to the data line; and, a control line for controlling an other switch associated with an other one of the sub-pixels for translating charge integrated by the other one sub-pixel to the one sub-pixel for communication to the data line whereby the sub-pixels are selectively discharged by control from the gate line and control line.

14. The assembly as defined in claim 13 wherein said first switch and said other switch comprise TFTs.

15. The assembly as defined in claim 14 wherein each pixel includes four of said sub-pixels and four of said TFTs.

16. The assembly as defined in claim 15 wherein a second control line is disposed for controlling two TFTs of said four sub-pixels, said control line controls one of said TFTs and said gate line controls one of said TFTs.

17. The assembly as defined in claim 16 wherein said gate line controls the one TFT for translating charge from the one sub-pixel in direct communication with the data line.

18. The assembly as defined in claim 16 wherein said control line and said second control line are global to said array.

19. An imaging apparatus including a sensor array with a reduced number of address lines for selectively addressing individual sensor elements of the array, the apparatus comprising:

a plurality of associated sub-pixels forming a pixel cluster of the array wherein the plurality selectively discharge integrated charge to a common data line associated with the pixel cluster by control of a gate line and a control line;

each of the associated sub-pixels being enabled for discharge by either the gate line or the control line, wherein a one of the sub-pixels translates charge directly to the data line by a switch controlled by the gate line and others of the associated sub-pixels translate charge to the data line through said one sub-pixel by control of a switch controlled by the control line; and, wherein said control line is a global line to all said pixel clusters of the array.

20. The imaging apparatus as claimed in claim 19 wherein the pixel cluster comprises four sub-pixels.

21. The imaging apparatus as claimed in claim 20 wherein said control line comprises a first and a second control line.

* * * * *